United States Patent
Takagi et al.

(10) Patent No.: US 9,922,414 B2
(45) Date of Patent: Mar. 20, 2018

(54) DEFECT INSPECTION METHOD AND DEFECT INSPECTION DEVICE

(71) Applicant: Hitachi High-Technologies Corporation, Minato-ku, Tokyo (JP)

(72) Inventors: Yuji Takagi, Tokyo (JP); Minoru Harada, Tokyo (JP); Masashi Sakamoto, Tokyo (JP); Takehiro Hirai, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 95 days.

(21) Appl. No.: 14/773,319

(22) PCT Filed: Jan. 27, 2014

(86) PCT No.: PCT/JP2014/051606
§ 371 (c)(1),
(2) Date: Sep. 4, 2015

(87) PCT Pub. No.: WO2014/156262
PCT Pub. Date: Oct. 2, 2014

(65) Prior Publication Data
US 2016/0019682 A1 Jan. 21, 2016

(30) Foreign Application Priority Data
Mar. 29, 2013 (JP) .................. 2013-070976

(51) Int. Cl.
| G06T 7/00 | (2017.01) |
| H01L 21/66 | (2006.01) |
| G06K 9/62 | (2006.01) |

(52) U.S. Cl.
CPC ............. G06T 7/001 (2013.01); H01L 22/12 (2013.01); G06K 9/6202 (2013.01);
(Continued)

(58) Field of Classification Search
CPC ............. G06T 7/001; G06T 2207/10061; G06T 2207/30148; H01L 22/12; G06K 9/6284; G06K 9/6202; H01J 2237/2817
See application file for complete search history.

(56) References Cited

U.S. PATENT DOCUMENTS

| 6,476,388 B1 * | 11/2002 | Nakagaki ............. G01N 23/225 250/306 |
| 2002/0171051 A1 * | 11/2002 | Nakagaki ............ G01N 21/9501 250/559.4 |
| 2005/0258366 A1 * | 11/2005 | Honda .................... H01J 37/21 250/310 |

FOREIGN PATENT DOCUMENTS

| JP | 2005-285746 A | 10/2005 |
| JP | 5018868 B2 | 9/2012 |

OTHER PUBLICATIONS

Office Action dated Feb. 17, 2017 for related Korean Application No. 10-2015-7022681.
(Continued)

*Primary Examiner* — Bhavesh Mehta
*Assistant Examiner* — Menatoallah Youssef
(74) *Attorney, Agent, or Firm* — Miles & Stockbridge P.C.

(57) ABSTRACT

In order to reduce the amount of time it takes to collect images of defects, this defect inspection device is provided with the following: a read-out unit that reads out positions of defects in a semiconductor wafer that have already been detected; a first imaging unit that takes, at a first magnification, a reference image of a chip other than the chip where one of the read-out defects is; a second imaging unit that takes, at the first magnification, a first defect image that contains the read-out defect; a defect-position identification unit that identifies the position of the defect in the first defect image taken by the second imaging unit by comparing said first defect image with the reference image taken by the first (Continued)

● DEFECT IMAGE CAPTURING POINT
○ REFERENCE IMAGE CAPTURING POINT imaging unit; a third imaging unit that, on the basis of the identified defect position, takes a second defect image at a second magnification that is higher than the first magnification; a rearrangement unit that rearranges the read-out defects in an order corresponding to a path that goes through each of the read-out defects exactly once; and a stage-movement-path generation unit that selects the chip where the reference image corresponding to each defect is to be taken and generates a stage-movement path by determining stage-movement positions for the first and second imaging units.

30 Claims, 13 Drawing Sheets

(52) U.S. Cl.
CPC .. *G06K 9/6284* (2013.01); *G06T 2207/10061* (2013.01); *G06T 2207/30148* (2013.01); *H01J 2237/2817* (2013.01)

(56) References Cited

OTHER PUBLICATIONS

International Search Report from International Patent Application No. PCT/JP2014/051606, dated Apr. 28, 2014.
Office Action dated Feb. 6, 2017 for related Chinese Application No. 201480012327.9.
Office Action dated Jul. 13, 2017 for related China Application No. 201480012327.9.

* cited by examiner

● DEFECT IMAGE CAPTURING POINT
○ REFERENCE IMAGE CAPTURING POINT

● DEFECT IMAGE CAPTURING POINT
○ REFERENCE IMAGE CAPTURING POINT

|  |  | Fig. 4 | Fig. 6 |
|---|---|---|---|
| DEFECT-TO-REFERENCE | Σ MOVING DISTANCE [mm] | 2372.4 | 210.3 |
| REFERENCE-TO-DEFECT | Σ MOVING DISTANCE [mm] | 1060.7 | 1814.0 |
|  | Σ (MOVING DISTANCE) [mm] | 3433.0 | 2024.3 |

| | |
|---|---|
| DEFECT-TO-REFERENCE LOWER LIMIT DISTANCE (d1) | |
| REFERENCE-TO-DEFECT UPPER LIMIT DISTANCE (d2, d3) | |
| IMAGING INTERVAL | TIME | |
| | DISTANCE | |
| MOVING DISTANCE | |
| MOVING TIME | |

● DEFECT IMAGE CAPTURING POINT
○ REFERENCE IMAGE CAPTURING POINT

● DEFECT IMAGE CAPTURING POINT
○ REFERENCE IMAGE CAPTURING POINT

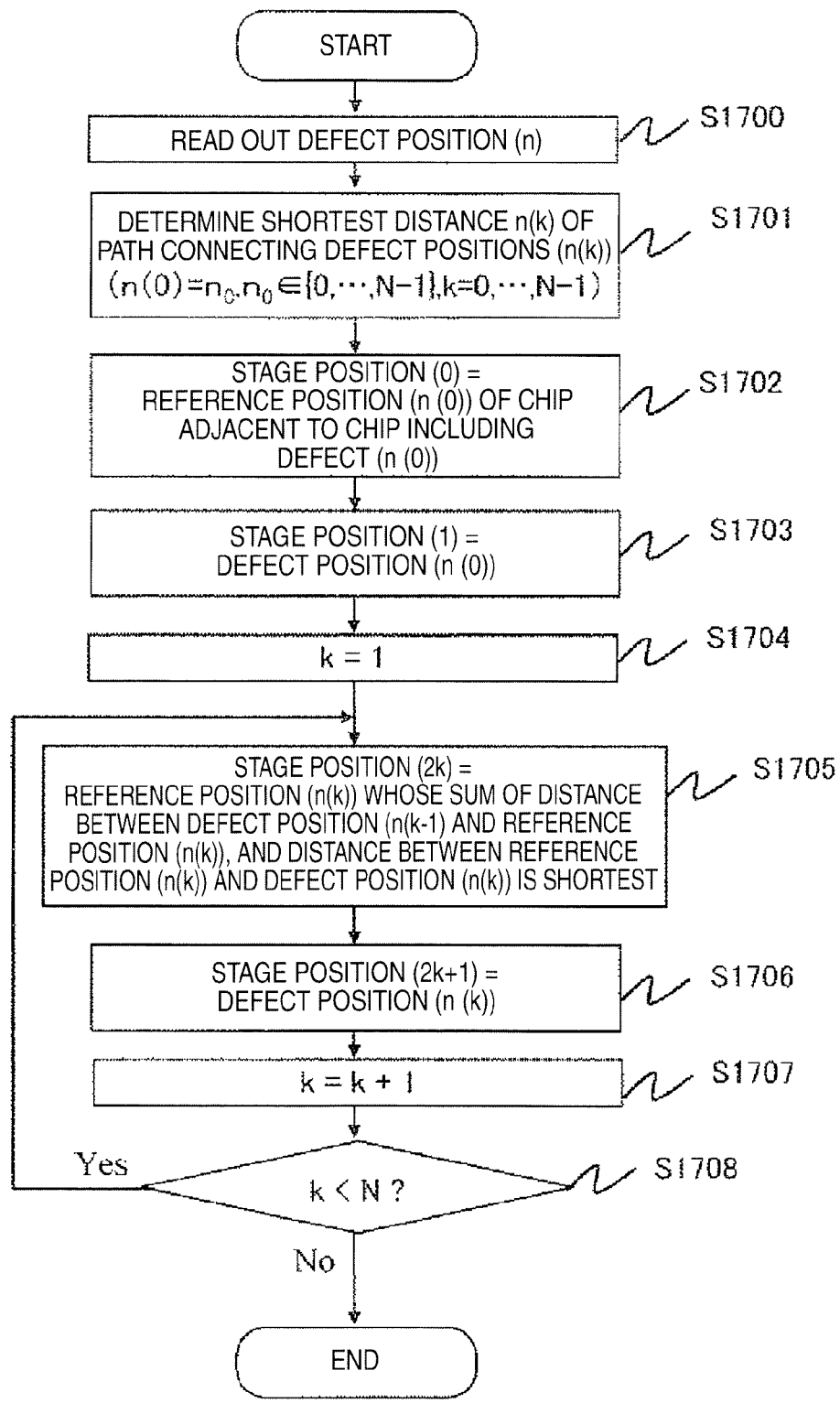

DEFECT INSPECTION METHOD AND DEFECT INSPECTION DEVICE

TECHNICAL FIELD

The present invention relates to a defect inspection method and a defect inspection device.

BACKGROUND ART

As a method for observing foreign matters and defects in detail by observing a sample, there is, for example, a method disclosed in Patent Literature 1. This method is configured such that, when, on the basis of coordinate data of a defect detected beforehand by another inspection device, an observation image of the defect is imaged, a reference image is captured at a low magnification at a position corresponding to the defect position of the chip of a wafer other than the wafer including the defect, then the stage holding the sample is moved so that the defect image is captured at the low magnification, the defect position on the defect image is identified by comparing the reference image with the defect image, and then the defect is enlarged and imaged.

CITATION LIST

Patent Literature

PATENT LITERATURE 1: JP-B-5018868

SUMMARY OF INVENTION

Technical Problem

It is desired that a collection of images of defects on a semiconductor wafer can be performed in a short time for all or a predetermined number of defects detected by an inspection device.

In Patent Literature 1, it is disclosed that, when the defect is enlarged and imaged, a reference image to be compared with the image of the defect is captured on a chip (reference chip) other than the chip (defect chip) including the defect. More specifically, it is disclosed that a chip close to the defect chip is imaged to capture a reference image, or reference images corresponding to the defect to be observed are collectively captured in a reference chip before imaging the defect.

In a method in which a reference image is captured on a chip close to a defect chip, when the wafer is moved from the imaging position of the reference image to the imaging position of the defective image, the wafer needs to be moved by a distance corresponding to one chip irrespective of the defect position in the wafer. The method of identifying the defect position by comparing the reference image with the defect image is a method necessary for a logic pattern of not-periodic pattern layout. However, in logic ICs, many of which have large chip sizes, the moving distance for one chip becomes large, so that the moving time is increased. Further, when the observation device is a scanning electron microscope (SEM), the imaging position of the reference image is separated in distance from the one previous defect position. Therefore, the focusing process of SEM needs to be performed before capturing the reference image, and hence the time for this is also increased.

In the method in which reference images corresponding to defects to be observed are collectively captured on respective chips before defect imaging, the imaging positions of the reference images become close to each other, so that the moving distance becomes short. However, on the other hand, the rate of increase in the distance between the imaging position of the reference image and the imaging position of the defect is increased. At this time, in the process of comparing the reference image with the defect image, the process variation in the wafer surface becomes conspicuous as a difference on the images, as a result of which the possibility that the defect position is erroneously identified is increased, and the acquisition of suitable defective observation images becomes difficult.

The present invention has been made in order to solve the above described problems. An object of the present invention is to provide a method for stably acquiring defect observation images and a device using the method.

Solution to Problem

In order to achieve the above-described object, the present application is configured by including: a read-out unit configured to read out a plurality of defect positions of a semiconductor wafer, the defect positions being detected beforehand by an inspection device; a first imaging unit configured to capture, at a first magnification, a reference image of a chip other than a chip including any one of the plurality of defects read out by the read-out unit; a second imaging unit configured to capture, at the first magnification, a first defect image including the plurality of defects read out by the read-out unit; a defect-position identification unit configured to identify a defect position on the first defect image by comparing the reference image captured by the first imaging unit with the first defect image captured by the second imaging unit; and a third imaging unit configured to capture, at a second magnification higher than the first magnification, a second defect image on the basis of the defect position identified by the defect-position identification unit, and further including: a rearrangement unit configured to rearrange the plurality of defects read out by the read-out unit, in order of a path making a circuit of the plurality of defects without overlaps: and a stage-movement-path generation unit configured to generate a stage-movement path in such a manner that a chip imaged to capture the reference image is selected for each of the defects which corresponds to the reference image, and stage-movement positions are determined in the first imaging unit and the second imaging unit.

Advantageous Effects of Invention

According to the present invention, it is possible to provide a defect inspection method and a defect inspection device in each of which the reliability at the time of identifying a defect position is improve, so that a defect observation image can be stably captured.

BRIEF DESCRIPTION OF DRAWINGS

FIG. 17 shows a flow chart of a stage-movement-path generation procedure of embodiment 3.

DESCRIPTION OF EMBODIMENTS

Embodiment 1

Figure 1:
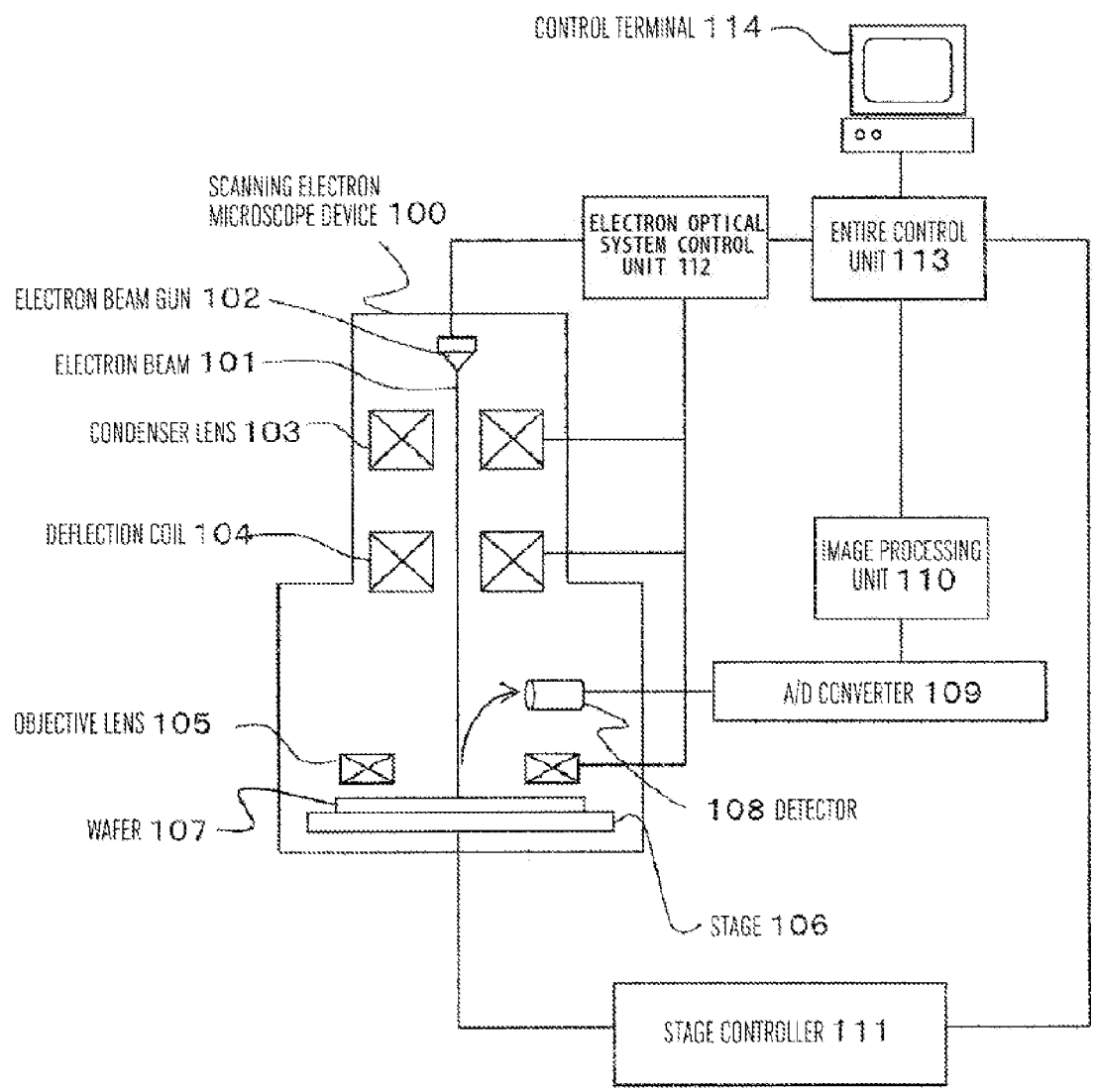
FIG. 1 is a view showing a configuration of an embodiment of the present invention.

FIG. 1 is a view showing an entire configuration of a defect observation device according to the present invention. A scanning electron microscope 100 according to the present embodiment is configured by a stage 106 mounted with a wafer 107, an irradiation optical system which controls an electron beam 101 emitted from an electron beam gun 102, a detector 108 configured to detect secondary electrons emitted from a sample, and a signal processing system of the detected signals. The irradiation optical system is configured by the electron beam gun 102, and a condenser lens 103, a deflection coil 104 and an objective lens 105 which are provided on the path of the electron beam 101. By this optical system, the electron beam 101 is condensed in a predetermined region including a defect to be observed on the wafer 107. The secondary electrons detected by the detector 108 are converted into digital signals by an A/D converter 109. The converted digital signals are sent to an image processing unit 110, in which the digital signals stored in a memory are taken out as required, and in which, on the basis of the signals, image processing is performed, so that detection of a defect position in an image, or the like, is performed. Reference numeral 111 denotes a stage controller, and reference numeral 112 denotes an electron optical system control unit. Further, reference numeral 113 denotes an entire device control unit, and reference numeral 114 denotes a control terminal connected to the control unit. A recording medium (not shown) can be connected to the image processing unit 110, the entire control unit 113, the control terminal 114, or the like, and it is configured such that a program to be executed by the image processing unit 110 can be read out from the recording medium, so as to be loaded to the image processing unit 110.

Figure 2:
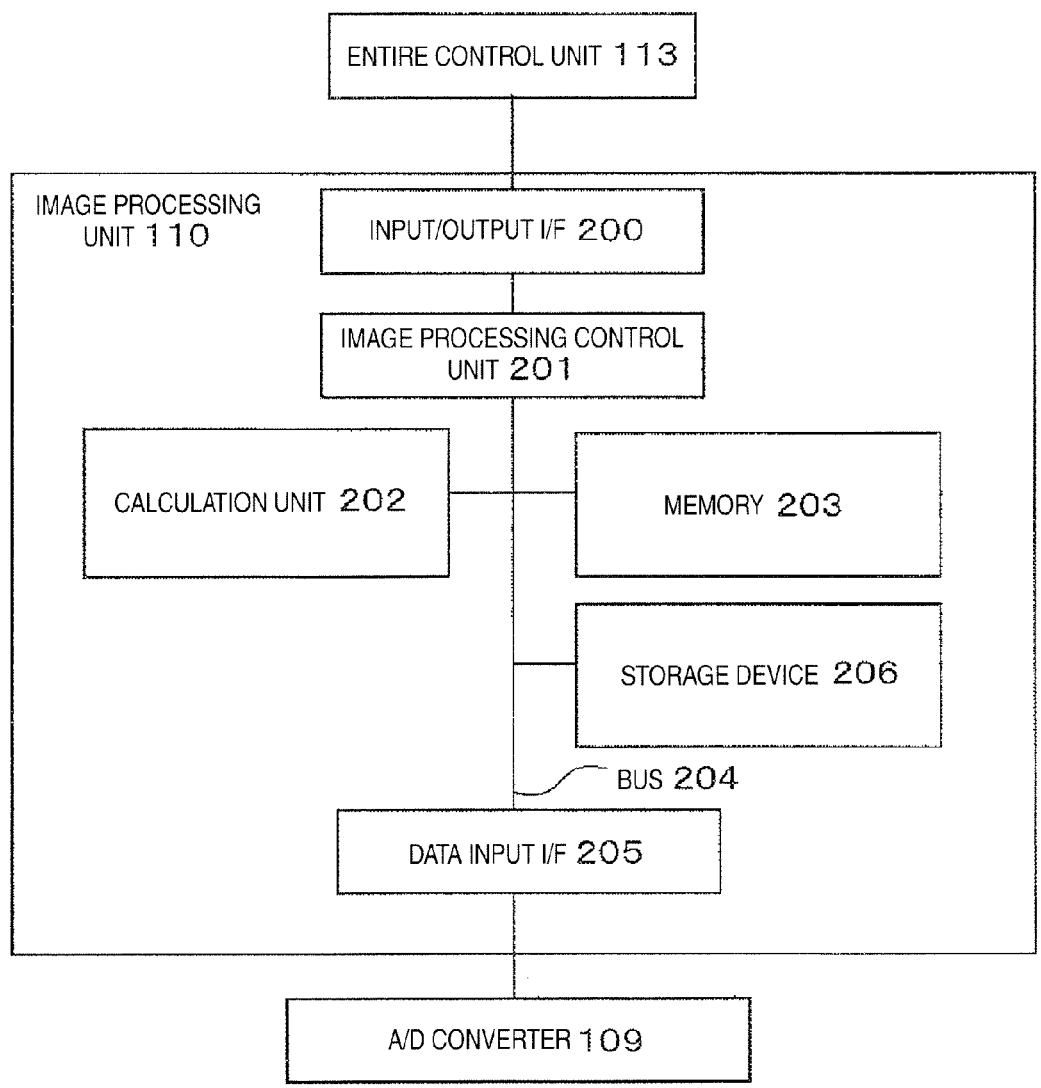
FIG. 2 is a view showing an internal configuration of an image processing unit.

FIG. 2 is a view showing a configuration of the image processing unit 110. Secondary electron signals converted into digital signals by the A/D converter 109 are sent to a memory 203 via a data input I/F 205 and are stored, as readable image data, in the memory 203. An image processing program is read out from the memory 203 or the storage medium by an image processing control unit 201. By controlling a calculation unit 202 according to the program, the image processing control unit 201 processes the image data stored in the memory 203, or intermediate process data obtained as a result of processing the image data. A defect observation image is sent to the entire control unit 113 via an input/output I/F 200, and the image of the defect observation image is displayed, as required, on the control terminal shown in FIG. 1. Further, the operation command to the image processing unit 110 is inputted into the image processing control unit from the entire control unit 113 via the input/output I/F 200. Transmission and reception of data in the image processing unit 110 are performed via a bus 204.

Figure 3:
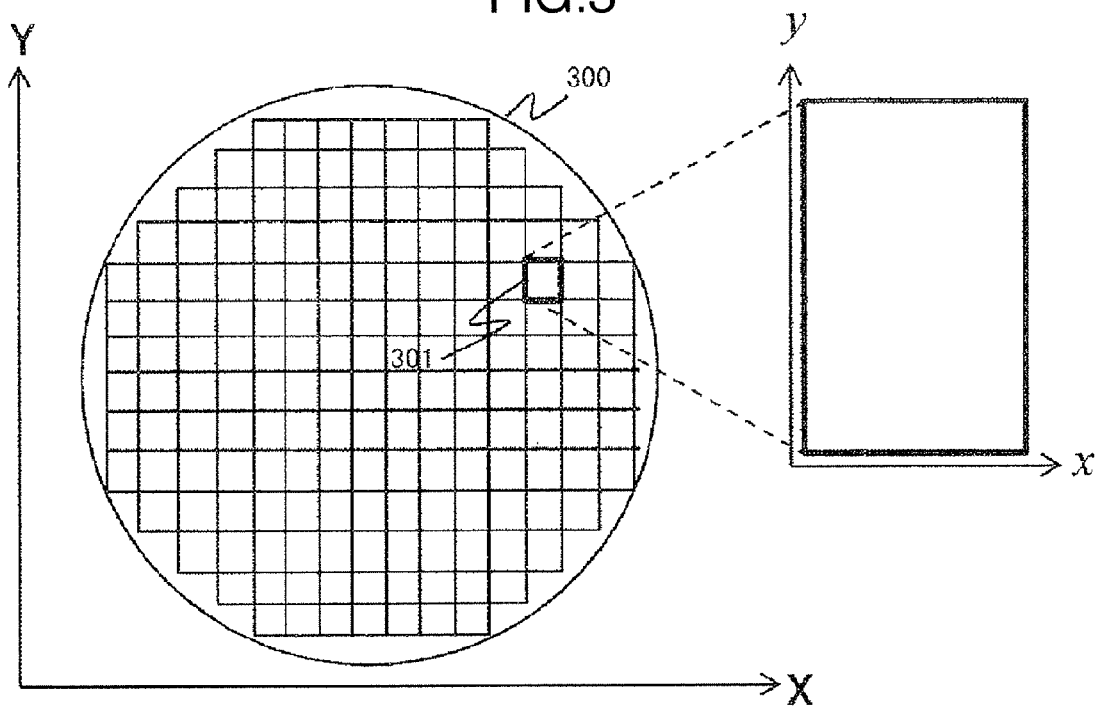
FIG. 3 is an illustration of a wafer and a chip.
Figure 4:
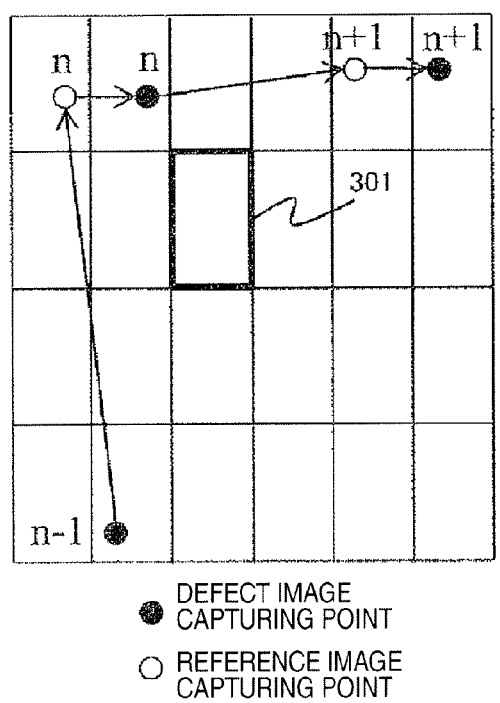
FIG. 4 is a view showing a conventional stage-movement path.

A conventional method of acquiring a high-magnification observation image of a defect on a semiconductor wafer by chip comparison will be described by use FIG. 3, FIG. 4 and FIG. 5. FIG. 3 shows a wafer 300 on which chips, each of which is denoted by reference numeral 301, are formed in a lattice pattern. On the wafer, there are two coordinate systems, one of which is a wafer coordinate system (X, Y) capable of uniquely identifying the position on the wafer, and the other of which is a chip coordinate system (x, y) defined for each of the chips. The same circuit pattern is formed on each of different chips having the same chip coordinates. FIG. 4 is an enlarged view of an arbitrary part in FIG. 3. Black dots in FIG. 4 are defect positions detected by an inspection device and are positions where defect images are captured. White circles in FIG. 4 are positions where reference images to be compared with the defect images are imaged. Numbers n−1, n, n+1, which are respectively given to the black dots, respectively represent defect numbers. Numbers, which are respectively given to the white circles, respectively represent imaging positions of reference images respectively acquired corresponding to the defective numbers. The imaging position of the reference image of number n−1 is omitted in FIG. 4. Conventionally, after, on a chip close to a chip including a defect, a reference image is captured at the same chip coordinates as those of the defect, moving to the chip including the defect, and an observation image of the defect is captured.

Figure 5:
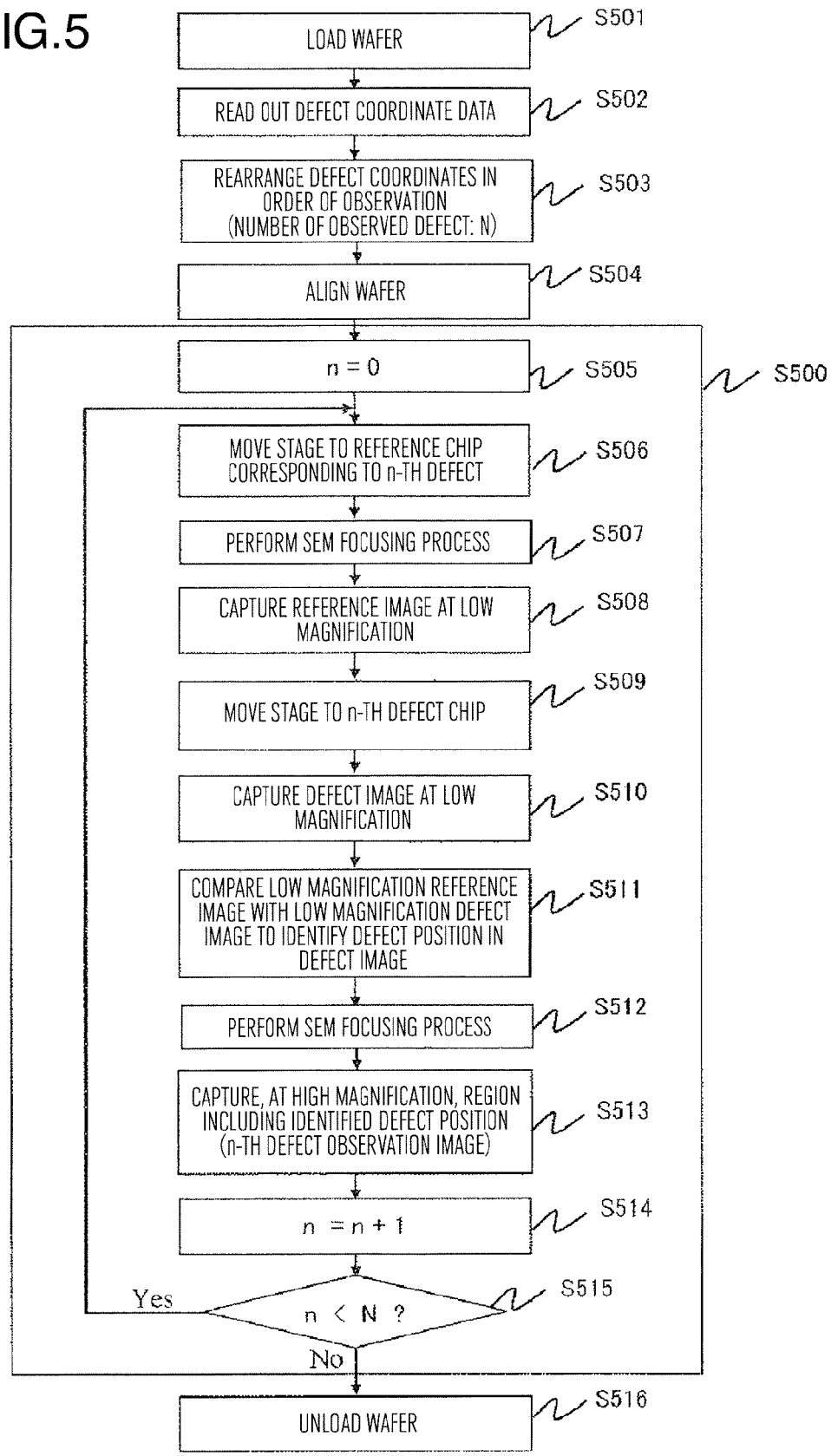
FIG. 5 shows a flow chart of an imaging procedure of a die comparison in a defect observation device.

FIG. 5 shows a flow chart of this procedure. First, a wafer to be observed is loaded to the stage 106 of the scanning electron microscope device 100 shown in FIG. 1 (S501). Next, defect coordinate data of defects detected beforehand by an inspection device are read out via an external input and output I/F (not shown) of the entire control unit 113 (S502). Among the defects, defect coordinates of N defects to be observed are rearranges in order of observation of defects and are respectively numbered as 0, 1, . . . , N−1 (S503). The details of the rearrangement will be described below with reference to FIG. 8. Next, the wafer is aligned (S504). This is because that, in order that, when the stage 106 is moved on the basis of the positions of the defect coordinates described in the coordinates on the wafer, the position of the target defect coordinates is located at the center of a visual field, the wafer coordinates are made associated with the stage coordinates by using positioning marks (fiducial marks) on the wafer, the coordinates on which are known.

Subsequently, a series of procedures shown in S500 are successively repeated for all the defects, so that high-magnification defect observation images are acquired. First, move to a position of a chip which is adjacent to the chip including the n-th defect, and whose chip coordinates are the same as the chip coordinates of the n-th defect (S506). In the following, a chip, on which a reference image corresponding to an observation defect is captured, is referred to as a reference chip, and a chip including a defect to be observed is referred to as a defect chip. However, the reference chip is not limited to a chip adjacent to a chip including a defect to be observed as in the present embodiment. Further, irrespective of whether the reference chip and the defect chip are the same with each other or not, the chip coordinates of the reference image-capturing position are the same as the chip coordinates of the defect position. After the movement, focusing process of the scanning electron microscope (SEM) is performed (S507), a reference image is captured at a low magnification (first magnification). Defects at a defect coordinate position are not necessarily due to errors, such as an error resulting from characteristics of the defect detection position in the defect inspection device, an error in the stage coordinates between the defect inspection device and the scanning electron microscope device 100, a braking error of the stage 106, and the like. For this reason, a defect image and a reference image are captured at a first magnification decided by a visual field allowing these errors, and a defect position is detected by comparing the defect image with the reference image. At the detection position, a defect observation image is captured at a second magnification. Since the first magnification is lower than the second magnification, the first magnification is described as low magnification in S508. In the following, the first magnification is expressed as low magnification, and the second magnification is expressed as high magnification. Therefore, the low magnification at the time of capturing the reference image and the defect image means that the low magnification of the reference image and the low magnification of the defect image are equal to each other to a degree that the images can be compared with each other (or that the visual field of the reference image is equal to the visual field of the defect image).

Next, the stage 106 is moved to the defect chip including the n-th defect (S509), and there, a defect image is captured at the low magnification (S510). The captured low magnification reference image and the captured low magnification defect image are image-processed and compared with each other, so that the defect position in the defect image is identified (S511). The SEM focusing process is performed so that the focal point at the identified defect position is focused (S512), and then a region including the identified defect position is imaged at the high magnification (S513). In S513, a defect inspection image may be obtained from the defect image captured in S510 by trimming the defect image so that the identified defect position matches the obtained image. For example, a reference image and a defect image, each correspond to the low magnification, are captured from a visual field having pixels larger than a defect observation image, and the defect observation image is obtained in such a manner the defect image captured corresponding to the low magnification by large pixels is trimmed so as to include the defect position identified in S511. When there is a next defect, the stage 106 is moved to the reference chip corresponding to the next defect, and the above-described processing is repeated. When all the defect observation images are captured, the processing is ended, and the wafer is unloaded from the stage 106.

Figures 6, 7:
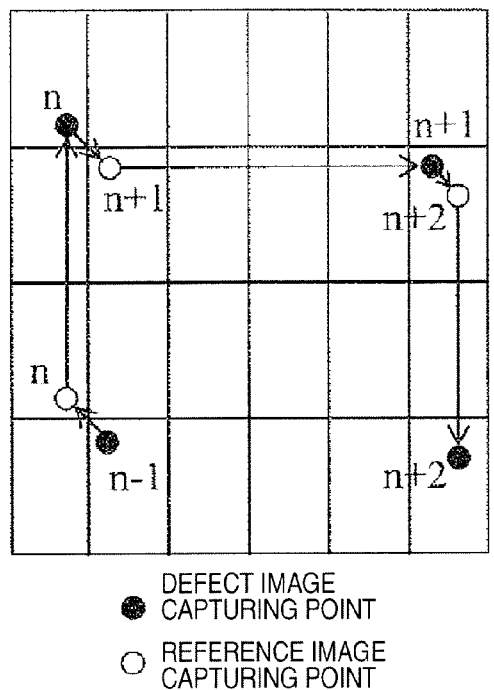
FIG. 6 is view showing a stage-movement path of embodiment 1.
FIG. 7 is a table of effect calculation results of embodiment 1.

FIG. 6 is a view showing a path for acquiring a defect observation image in embodiment 1. In the present embodiment, a stage-movement path is generated so that a chip imaged to capture a low-magnification reference image, that is, a reference chip, is set as a chip having a reference imaging position closest to the just-previous defect position. That is, as shown in FIG. 6, the reference chip corresponding to the defect number n is not a chip adjacent to the defect chip located at the position of detect number n, but among reference image-capturing positions of eight chips adjacent to a chip having the defect number n−1, the reference chip is located at the reference image-capturing position closest to the position of defect number n−1. The reference chip corresponding to the defect number n+1 is also selected in the same way. That is, among reference image-capturing positions of eight chips adjacent to the chip having the defect number n+1, the defect chip located at the position closest to the defect position of the defect number n+1, that is, the defect chip of the defect number n+1 is set as the reference chip corresponding to the defect number n+2.

The stage-movement distance at the time when the reference chips are set in this manner is qualitatively compared with the stage-movement distance of the conventional method shown in FIG. 4. In both the method shown in FIG. 4 and the method shown in FIG. 6, a long-distance movement between defects is combined with a short-distance movement between a defect and a reference. The short-distance movement in the conventional method, that is, a movement from a reference image-capturing position to a defect image-capturing position necessarily results in a moving distance of one chip. In the embodiment of FIG. 4, the moving distance corresponds to the width of a chip in the x direction. On the other hand, in the method shown in FIG. 6, the short-distance movement, that is, the movement from a defect image-capturing position to a reference image-capturing position varies depending on locations, but surely results in a distance less than the distance of one chip. In the short-distance movement, the method shown in FIG. 6 is always advantageous in view of the sum of distances of short-distance movements. As for the long-distance movement, in both the conventional method and the method of the present embodiment, a path between a defect position and the next defect position is determined via a reference image-capturing position. Therefore, the sum of long-distance movement distances in the conventional method and the sum of long-distance movement distances in the method of the present embodiment are qualitatively substantially equal to each other on a case-by-case basis.

As shown in FIG. 7, in a computer, in the state where the chip size is set to 5 mm, and 150 points of defects are randomly set on a 300-mm wafer, a shortest path, through which all the defects are imaged only once, is generated. Then, after reference image-capturing positions are determined respectively by the method of FIG. 4 and the method of FIG. 6, defect-to-reference distances of movements and reference-to-defect distances of movements are summed in each of the method of FIG. 4 and the method of FIG. 6. The results of the sums are shown in FIG. 7. In the case of the method of FIG. 4, the sum of short moving distances (reference-to-defect distances) is 1060.7 mm, while in the case of the method of FIG. 6, the sum of short moving distances (defect-to-reference distances) is 210.3 mm which is one fifth of the total short moving distance obtained in the case of the method of FIG. 4. Further, in the case of the method of FIG. 4, the sum of long moving distances (defect-to-reference distances) is 2372.4 mm, while in the case of the method of FIG. 6, the sum of long moving distances (reference-to-defect distances) is 1814.0 mm, which show that the total long moving distance in this case is also reduced. When the total short and long moving distances are summed in each of the methods of FIG. 4 and the method of FIG. 6, the sum in the method of FIG. 4 is 3433.0 mm, while the sum in the method FIG. 6 is 2024.3 mm. This shows that the stage moving distance in the method FIG. 6 can be reduced by 41% as compared with the method of FIG. 4. Even when the effect of reduction in the distance of long-distance movement is excluded, the reduction distance in the short-distance movement is 850.4 mm, which is 24.7% of the total moving distance of 3433.0 mm in the method of FIG. 4. About the stage-movement time, because the stage moving time is influenced by the difference in the control method depending on the hardware of the stage, the stage moving time cannot be generally said. However, it is obvious that the reduction of the total moving distance by an order of 10% leads to reduction of the total stage moving times.

Figure 8:
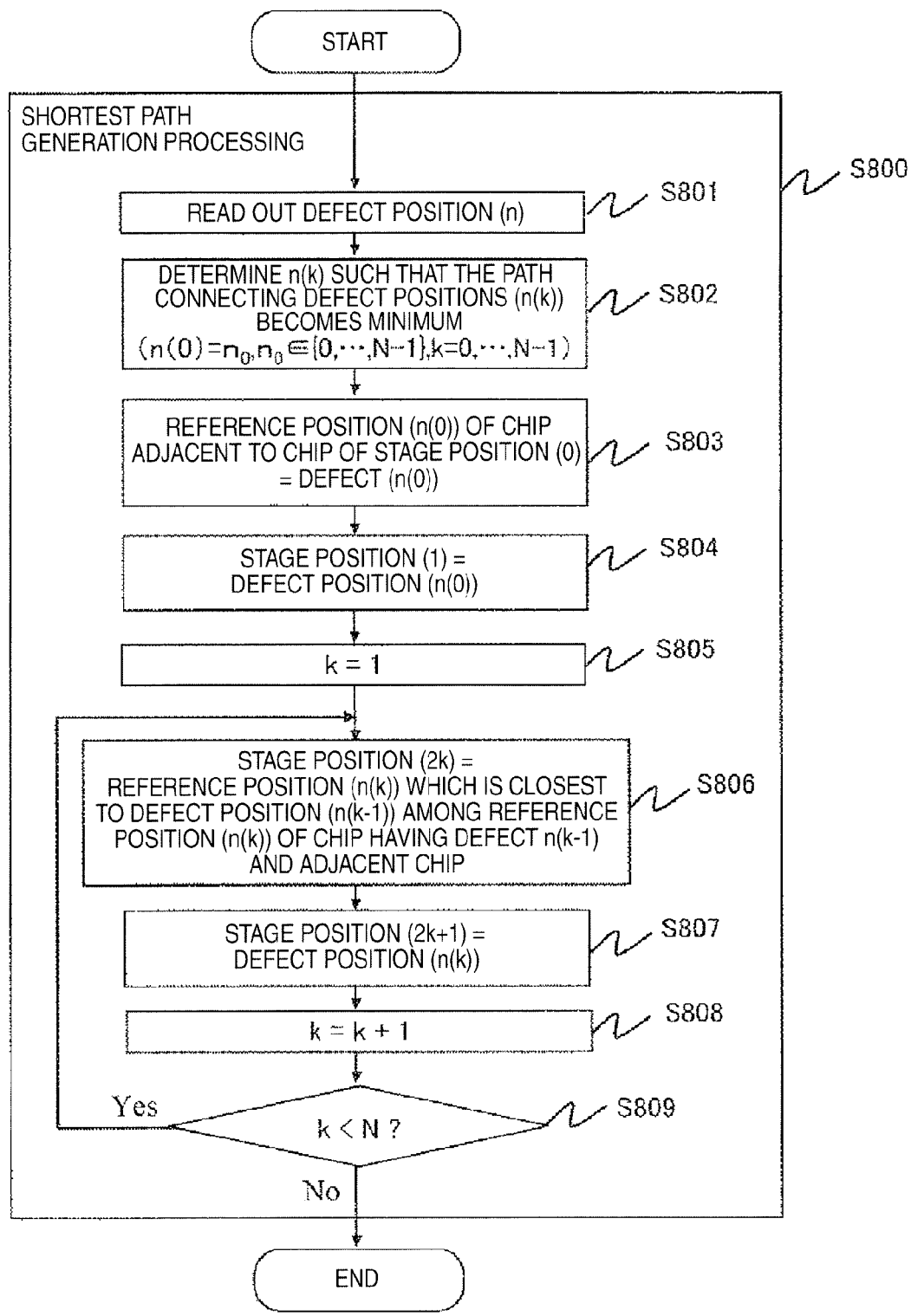
FIG. 8 shows a flow chart of a stage-movement-path generation procedure of embodiment 1.

FIG. 8 shows a generation procedure of a stage-movement position of a part in 500 of FIG. 5. First, defect coordinate data having, as information, a defect position (n) of a defect detected by the inspection device is read out via an external input and output I/F (not shown) of the entire control unit 113 (S801). In the following, it is assumed that a defect position (n) expresses position coordinates capable of uniquely identifying a defect number n, and that a defect (n) represents a defect of defect number n. Similarly, it is assumed that a reference position (n) uniquely identifies a reference image-capturing position corresponding to the defect number n. For N defects which are read out from read-out defect coordinate data and which are to be observed, a path of shortest distance, through which path all the defects are imaged only once, is generated (S802). The determination of the path is referred to as a traveling salesman problem, in which, when paths are searched in a round-robin manner, the number of calculations is increased as the number of defects is increased, so that the calculation becomes difficult. As practical solutions of this problem, there are known methods such as a branch and bound method which is an exact solution giving an optimal solution, and a Christofides algorithm which is one of methods giving a semi-optimal solution and in which a solution within 1.5 times a theoretical minimum value is guaranteed. In S802, a first point is expressed as n0 which is one of input defect numbers of 0 to N−1, and a defect number, set in the order of the generated path, is expressed as k, and a defect number at the time of input, which defect number corresponds to k, is expressed as n (k).

A reference position (n (0)) of a chip adjacent to a chip of a defect (n (0)) is set as a stage position (0) which is a reference image-capturing position of a first defect (k=0) (S803). Next, the defect position (n (0)) is set as a stage position (1) (S804). Subsequently, processes from S806 to S809 are repeated according to the defect number k set in the order of the generated path. First, among reference positions (n (k)) adjacent to a chip of a defect (n (k−1)), a reference position (n (k)) closest to the defect position (n (k−1)) is sets as a stage position (2k) (S806). In this way, a chip imaged to capture a low-magnification reference image is selected, and then a stage-movement position, where the low-magnification reference image can be captured on the selected chip, is set, that is, a moving path is generated. Next, the defect position (n (k)) is set as a stage position (2k+1) (S807). When all the defects are processed, the processing is ended, and when there is a remaining defect, the processes of S806 to S809 are repeated. In the following, the entire process flow shown in FIG. 8 is referred to as a shortest path generation processing 800.

The above calculations are performed in a calculation processing unit (not shown) in the entire control unit 113 of FIG. 1, and the determined stage position (q) (q=0, . . . , 2N−1) is stored in a storage unit (not shown) in the entire control unit 113. Next, at the time of defect observation, the stage positions (q) are successively read out from a storage unit, and the stage 106 is successively moved to the stage positions (q) via the stage controller 111. At the defect (n (round (q/2))), a low-magnification reference image, a low-magnification defect image, and a high-magnification defect image are captured. Here, round (x) expresses an integer obtained by truncating the decimal point of x.

Figure 9:
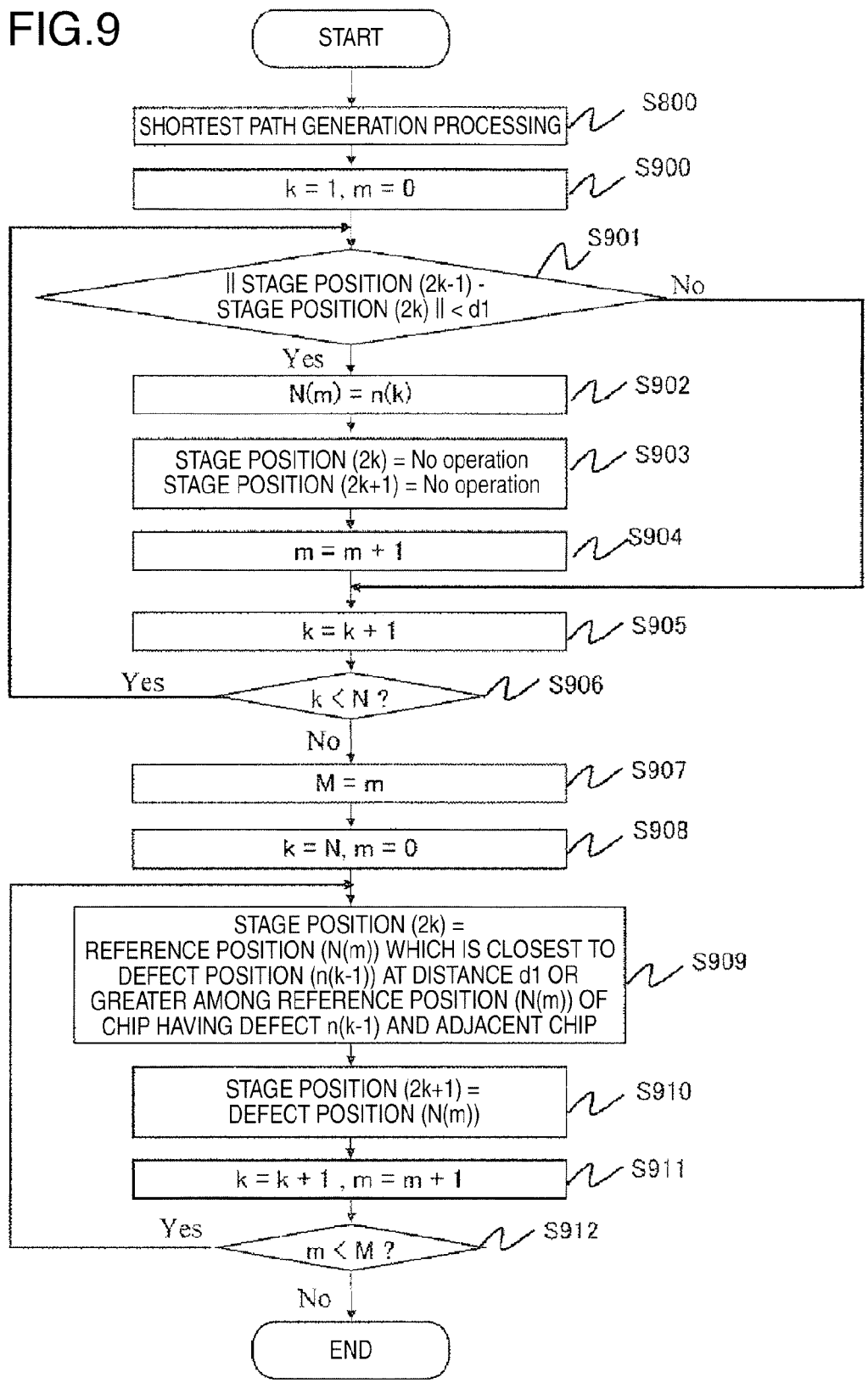
FIG. 9 shows a flow chart of a stage-movement-path generation procedure when a defect imaging position and a reference image-capturing position are adjacent to each other.

The present invention intends that a defect imaging position and a low-magnification reference image-capturing position corresponding to the next defect are made close to each other, so that the SEM focusing process at the time of capturing the low-magnification reference image is made unnecessary, and thereby the whole imaging time can be reduced. However, in the case where a defect imaging position is extremely close to a low-magnification reference image-capturing position corresponding to the next defect, at the time of capturing the low-magnification reference image, it is necessary to readjust the focus of SEM due to the influence of electrification caused by the electron beam irradiation performed by the just previous imaging process. Therefore, the distance between a defect imaging position and a low-magnification reference image-capturing position corresponding to the next defect needs to be maintained at a fixed distance or more. FIG. 9 shows a procedure for generating a stage-movement path satisfying this condition.

First, the shortest path generation shown in FIG. 8 is performed (S800). In the processes of S901 to S906, the distance between each defect imaging position and the low-magnification reference image-capturing position corresponding to the next defect is compared with a previously set distance d1 (S901). In S901, the stage position (2k−1) corresponds to the defect image-capturing position, and the stage position (2k) corresponds to the low-magnification reference image-capturing position, and the symbol ∥ expresses the distance between the two points. When the distance between the two points is less than d1 (or is d1 or less), the defect number is recorded as N (m) (S902), and the two points are deleted from the list of the stage positions generated in S800 (S903). When the stage position (q), at which No Operation is set, is read out from the storage unit (not shown) in the entire control unit 113, the entire control unit 113 does not issues a move command to the stage controller 111.

After the processing of all the defects is completed, the number of defects to be deleted is stored (S908). In the processing of S909 to S912, the reference position (N (m)) and the defect position (N (m)), which correspond to each of the deleted M defects, are added to the list of stage positions. The reference position (N (m)) is reselected on the basis of the shortest distance (S909). By performing the above processing, the distance between each of the defect imaging positions and a low-magnification reference image-capturing position corresponding to the next defect can be maintained at the distance d1 or more.

Figure 10:
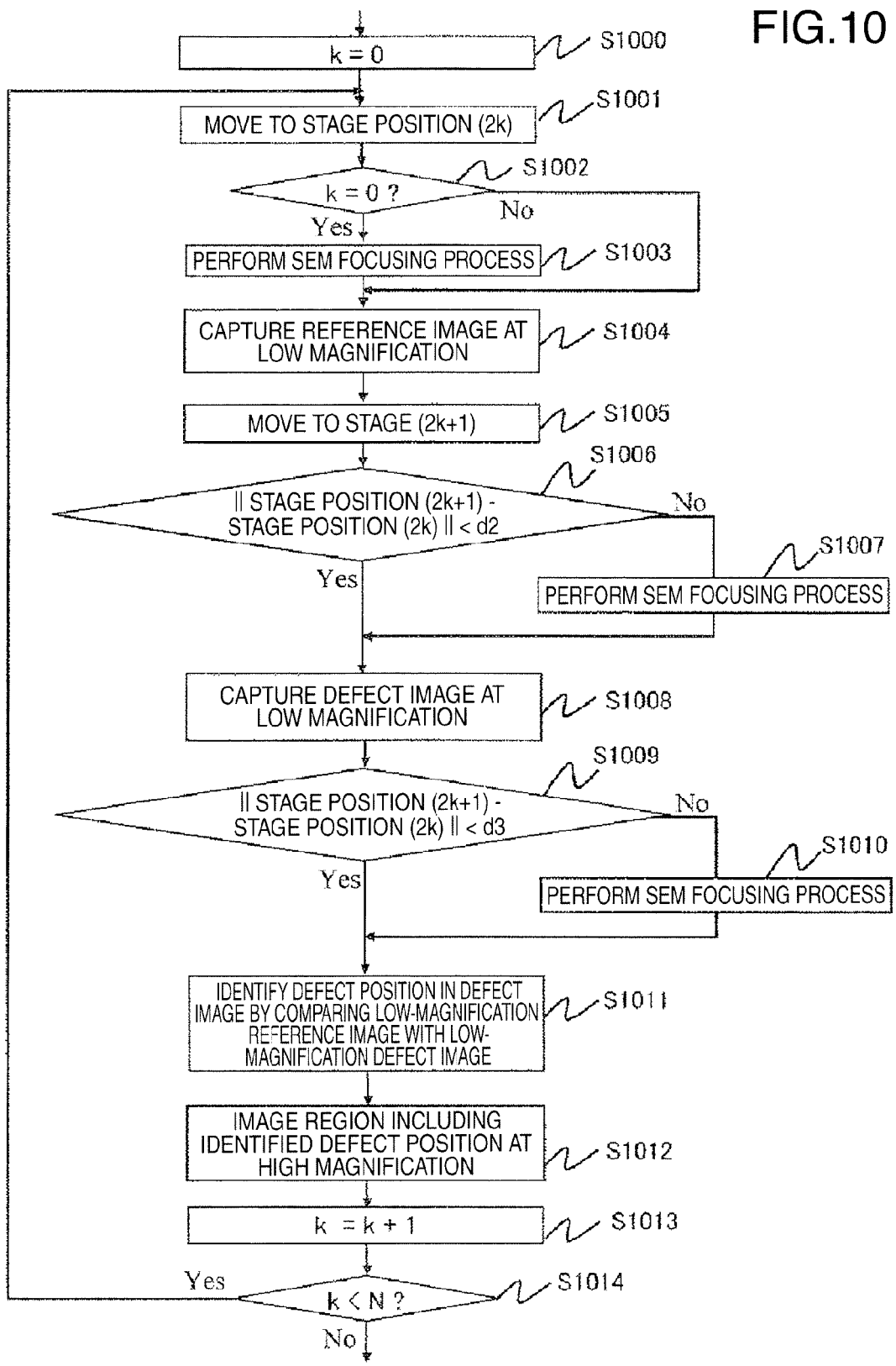
FIG. 10 shows a flow chart of a control procedure of implementation possibility of SEM focusing process.

Since an imaging position of a defect is basically away from the low-magnification reference image-capturing position corresponding to the defect, the SEM focusing process needs to be performed. However, when the defect imaging position is close to the low-magnification reference image-capturing position, the SEM focusing process can be omitted. FIG. 10 shows a procedure for obtaining a high-magnification defect observation image by repeatedly performing the processing of S1001 to S1012 for each of the defects, and from a functional perspective, the focus control procedure is incorporated in the portion equivalent to S500 in FIG. 5. The notation of stage position ( ) is common to FIG. 8 and FIG. 9.

First, the stage is moved to the stage position (2k), that is, the low-magnification reference image-capturing position (S1001). Except the first time (k=0), the SEM focusing process is not performed in the vicinity of the defect imaging position (2k−1) which is the just previous imaging position (S1002, S1003). A low-magnification reference image is captured (S1004), and the stage is moved to the stage position (2k+1), that is, the defect image-capturing position (S1005). In S1008, a defect image is captured. At this time, when the distance between the stage position (2k+1) and the stage position (2k) is less than a predetermined fixed distance d2 (or is the predetermined fixed distance d2 or less), the SEM focusing process is not to be performed (S1006, S1007). Further, when the distance between the stage position (2k+1) and the stage position (2k) is less than a predetermined fixed distance d3 (or is the predetermined fixed distance d3 or less), the SEM focusing process for high-magnification defect image capturing is not performed (S1009, S1010). Generally, the depth of focus at the time of acquiring a high-magnification image is shallow, and hence d2 and d3 are different. Subsequently, the defect position is identified by comparing the low-magnification reference image with the low-magnification defect image (S1011). In FIG. 10, it is described that the processes of S1009 to S1010 and S1011 are performed serially. However, the processes can be performed in parallel, and as long as the processing in S1010 is performed within the processing time of S1011, the processing in S1010 may be always performed. Finally, the region including the identified defect position is imaged at a high magnification (S1012). In the case where the condition shown in S1006 is satisfied continuously, even when the position is away from the position where the SEM focusing process is finally performed, the SEM focusing process is not performed. In order to prevent this, it may be configured such that the number of times that the processing is performed is previously provided, and such that, when the number of times that the SEM focusing process is not performed exceeds the prescribed number of times, the SEM focusing process is forcibly performed after the processing in S1006.

Figure 11:
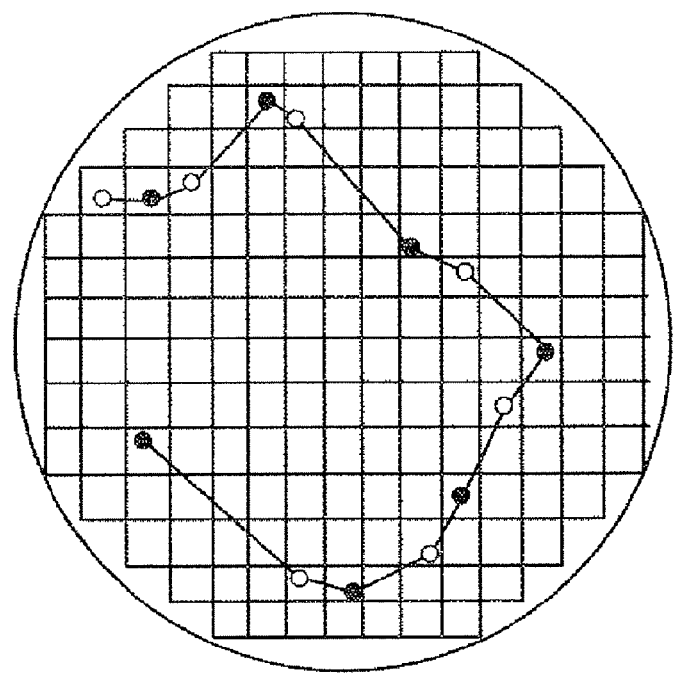
FIG. 11 shows display contents of a generated stage-movement path.
Figure 12:
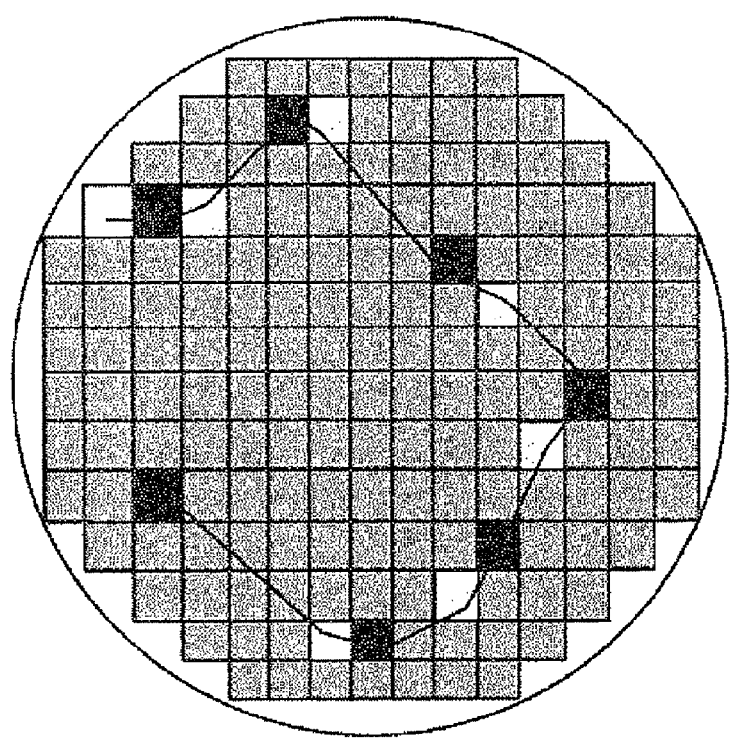
FIG. 12 shows display contents of a generated stage-movement path.
Figures 13, 14:
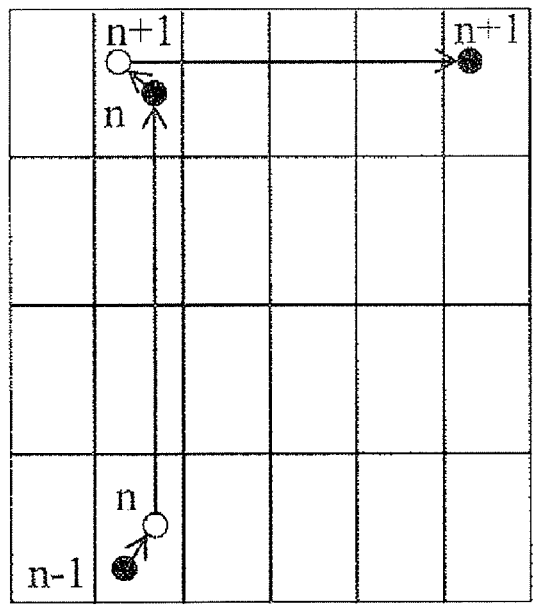
FIG. 13 shows display contents of parameter inputs and stage-movement path operation results.
FIG. 14 is view showing a stage-movement path of embodiment 2.

FIG. 11 and FIG. 12 show display examples of a generated stage-movement path. These display examples are displayed on the display of the control terminal 114 in FIG. 1. In each of FIG. 11 and FIG. 12, an outer periphery of a wafer and gratings formed by chips are drawn. In FIG. 11, a defect image-capturing position is represented by a black dot and a reference image-capturing position is represented by a white circle. Also in FIG. 11, a movement path is formed in such a manner that a black dot and a white circle are connected with each other. In FIG. 12, a chip including a defect image-capturing position is expressed by black, and a chip including a reference image-capturing position is expressed by white. Also in FIG. 12, a movement path is formed in such a manner that an imaging position in a black chip and an imaging position in a white chip are connected with each other. Each of these displays is used for confirmation after movement-path generation, or shows so that the present position of the stage during collection of defect observation images can be clearly seen. FIG. 13 shows a parameter input screen at the time of generating a movement path. FIG. 13 is configured such that the threshold values d1, d2 and d3 corresponding to the distances shown in FIG. 9 and FIG. 10 can be inputted. Although explanations in FIG. 8, FIG. 9 and FIG. 10 are omitted, the time interval between each pair of imaging points as well as the distance between each pair of imaging points are important in the path generation. That is, in the case where a previous imaging position is located in the very vicinity of an imaging position, when the time elapsed after the previous imaging is a fixed time or more, the influence of electrification, and the like, due to the previous imaging is small. However, the time after the previous imaging is small, the influence due to the previous imaging is large, and hence it is necessary to change the imaging order. On the contrary, in the case where a previous imaging position does not locate in the very vicinity of an imaging position, even when the time after the previous imaging is small, the influence due to the previous imaging is small. On the basis of these ideas, it is considered such that, in the state where a distance and time interval with respect to an imaging interval can be inputted, for example, a movement path is generated on the condition of satisfying a function evaluation value using, as variables, a distance and time interval between arbitrary imaging positions, or such that a movement path is generated so that a product of a distance and time interval between arbitrary images does not become a predetermined value or more, or such that a movement path is generated so that a distance between arbitrary imaging positions is a predetermined distance or more, and so that a time interval between the arbitrary imaging positions is a predetermined time interval or more.

By displaying a moving distance generated on the basis of the above-described input values, and a result of simulation of a moving time, which is calculated on the basis of stage control parameters, a moving distance and a moving time can be confirmed, and input parameters can be adjusted. Further, when FIG. 13 is displayed together with FIG. 11 or FIG. 12, it is possible to confirm the state of a generated path, a moving distance, and a moving time while changing the input parameters.

In the following, there is described a method in which the defect observation image collection procedure described by using FIG. 8 to FIG. 13 is implemented in the defect observation device shown in FIG. 1 and in the image processing unit shown in FIG. 2. The wafer 107 having defects to be observed is loaded to the length-measuring scanning electron microscope device 100 shown in FIG. 1, and is placed on the stage 106. Also, defect coordinate data are read out from an external storage medium (not shown) connected to the entire control unit 113, or read out through a local area network (not shown), or the like, connected to the entire control unit 113, and are stored in the storage unit (not shown) of the entire control unit 113. The calculation unit (not shown) of the entire control unit 113 reads out the stored defect coordinate data, and processes the computer program for performing the above-described stage-movement-path generation procedure, so that path information of stage-movement positions is stored in a storage unit (not shown) of the entire control unit 113. Similarly to the defect coordinate data, the program is also externally inputted, and is stored in a storage unit (not shown) of the entire control unit 113, and at subsequent times, the program is read out from the storage unit to be performed.

After placing and aligning the wafer, the entire control unit 113 successively reads out the stage-movement positions stored in the storage unit of the entire control unit 113, and performs the following processes. First, on the basis of the read-out stage-movement positions, the entire control unit 113 controls the stage 106 via the stage controller 111, and moves the stage 106 so that an imaging target portion corresponding to a reference pattern on the wafer is included in a visual field of the electron optical system. Next, after performing a focusing process by controlling the objective lens 105 by the electron optical system control unit 112 as required, the entire control unit 113 scans the electron beam 101 on the pattern by controlling the deflection coil 104. The entire control unit 113 makes the A/D converter 109 convert, into digital signals, secondary electron signals obtained from the imaging target region. Then, the entire control unit 113 stores, as digital images, the reference images in the memory 203 via the data input I/F 205 in the image processing unit 110. Next, the entire control unit 113 reads out the next stage-movement position stored in the storage unit of the entire control unit 113. Then, by controlling the stage 106 via the stage controller 111, the entire control unit 113 moves the stage 106 so that the imaging target portion corresponding to the defect pattern on the wafer is included in the visual field of the electron optical system. In the following, the entire control unit 113 captures a defect image in the same manner as the reference image, and stores the digital image of the defect image in the memory 203.

The image processing control unit 201 makes the calculation unit 202 perform an image comparison processing between the low-magnification reference image and the low-magnification defect image which are stored in the memory 203, and detects a defective position. The entire control unit 113 receives the detect position information from the image processing unit 110 and transfers the received detect position information to the electron optical system control unit 112. Under the control of the entire control unit 113, the electron optical system control unit 112 converts the received detect position information into control information of the electron optical system, and controls the deflection coil 104 to capture the defect in the visual field center of the electron optical system. Further, the electron optical system control unit 112 controls the condenser lens 103 and the objective lens 105 so that a desired observation magnification is obtained, and controls the objective lens 105 to perform a focusing process as required. Then, the electron optical system control unit 112 controls the deflection coil 104 to make the electron beam 101 scan the defect region. The entire control unit 113 makes the A/D converter 109 convert, to digital signals, the secondary electron signals obtained from the imaging target region, and stores, as a digital image, a high-magnification defect image in the memory 203 via the data input I/F 205 in the image processing unit 110.

The entire control unit 113 reads out, via the input/output I/F 200, the high-magnification defect image which is the defect observation image and which is stored in the memo 203, and displays the read-out image on the display 114 of the control terminal. Also, the entire control unit 113 outputs the read-out defect observation image to the external storage medium (not shown) connected to the entire control unit 113, or outputs the read-out defect observation image to a upper-level server (not shown) via the local area network (not shown) connected to the entire control unit 113.

The displays of stage-movement paths shown in FIG. 11 and FIG. 12 may be displayed in the control terminal 114. During the time of collection of defect images, it is possible to display the present stage position in the path to thereby confirm the progress of processing as well as the position.

Further, by the control of the entire control unit 113, defect coordinate data are read out and stored, so that the stage-movement path can be generated. Therefore, it is possible that FIG. 13, which is a display screen for parameter inputs for path generating, is used so that a stage-movement distance and a moving time are calculated on the basis of the various parameters. Thereby, it is possible to make desired parameters obtained and stored in the storage unit of the entire control unit 113, and to use the obtained desired parameters at subsequent times. Further, as described above, when FIG. 11 or FIG. 12 is displayed together with FIG. 13, it is possible to simultaneously confirm the state of generated path, the moving distance, and the moving time while changing the input parameters.

As described above, the distance of the stage-movement path is reduced in order to reduce the number of times of SEM focusing processes, so that defect observation images of defects on a wafer can be collected in a short time.

Embodiment 2

The second embodiment of the present invention will be described by using FIG. 14 and FIG. 15.

FIG. 14 shows a path for acquiring a defect observation image in the second embodiment. The present embodiment is configured such that, as a chip for capturing a low-magnification reference image, that is, a reference chip, a chip including a just previous defect is selected, and such that a stage-movement path is generated by using the selected chip. That is, as shown in FIG. 14, the reference image-capturing position of the chip located at the defect number n−1 is set as the reference chip corresponding to the defect number n. The reference chip corresponding to the defect number n+1 is also selected in the same manner, and then, the same processing is subsequently repeated.

The stage-movement distance obtained in the case where the reference chips are set in this way is qualitatively compared with the stage-movement distance obtained by the conventional method shown in FIG. 4. In both the method shown in FIG. 4 and the method shown in FIG. 14, a stage-movement path is formed by paths each formed by combining a long-distance movement between defects and a short-distance movement between a defect and a reference. In order to move a short distance in the conventional method, that is, in order to move from a reference image-capturing position to a defect image-capturing position, it is necessary to move a distance of one chip. In the example of FIG. 4, the moving distance corresponds to the width of a chip in the x direction. On the other hand, in the method shown in FIG. 14, in order to move a short distance, that is, in order to move from a defect image-capturing position to a reference image-capturing position, it is only necessary to move a distance less than the distance of one chip, although the moving distance is different depending on the positions. In view of the sum of the moving distances, the short-distance movement in the method shown in FIG. 14 is always more advantageous. As for the long-distance movement, it is on a case-by-case basis, but they are qualitatively substantially equal. FIG. 15 shows a stage-movement-position generation procedure which is a part of S500 of FIG. 5. First, defect coordinate data having, as information, a defect position (n) of a defect detected by the inspection device is reads out via an external input and output I/F (not shown) of the entire control unit 113 (S1500). Then, N defects to be observation are selected from the read-out defect coordinate data, and a minimum distance path is determined on the basis of the condition that each defect is visited only one time (S1501).

A reference image-capturing position of a first defect (k=0) is set as a stage position (0), and a reference position (n (0)) of a chip adjacent to a chip including a defect (n (0)) is set (S1502). Next, the defect position (n (0)) is set as a stage position (1) (S1503). Subsequently, the processing from S1505 to S1508 is repeated at the defect numbers k in order of the determined path. First, a reference position (n (k)) of a chip including a defect (n (k−1)) is selected as a stage position (2k) (S1505), and a stage-movement path is generated so that a low-magnification reference image can be captured at the selected chip. Next, the defect position (n (k)) is set as a stage position (2k+1) (S1506). When all the defects are processed, the processing is ended, and when there is a remaining defect, the processing of S1505 to S1508 is repeated.

Figure 15:
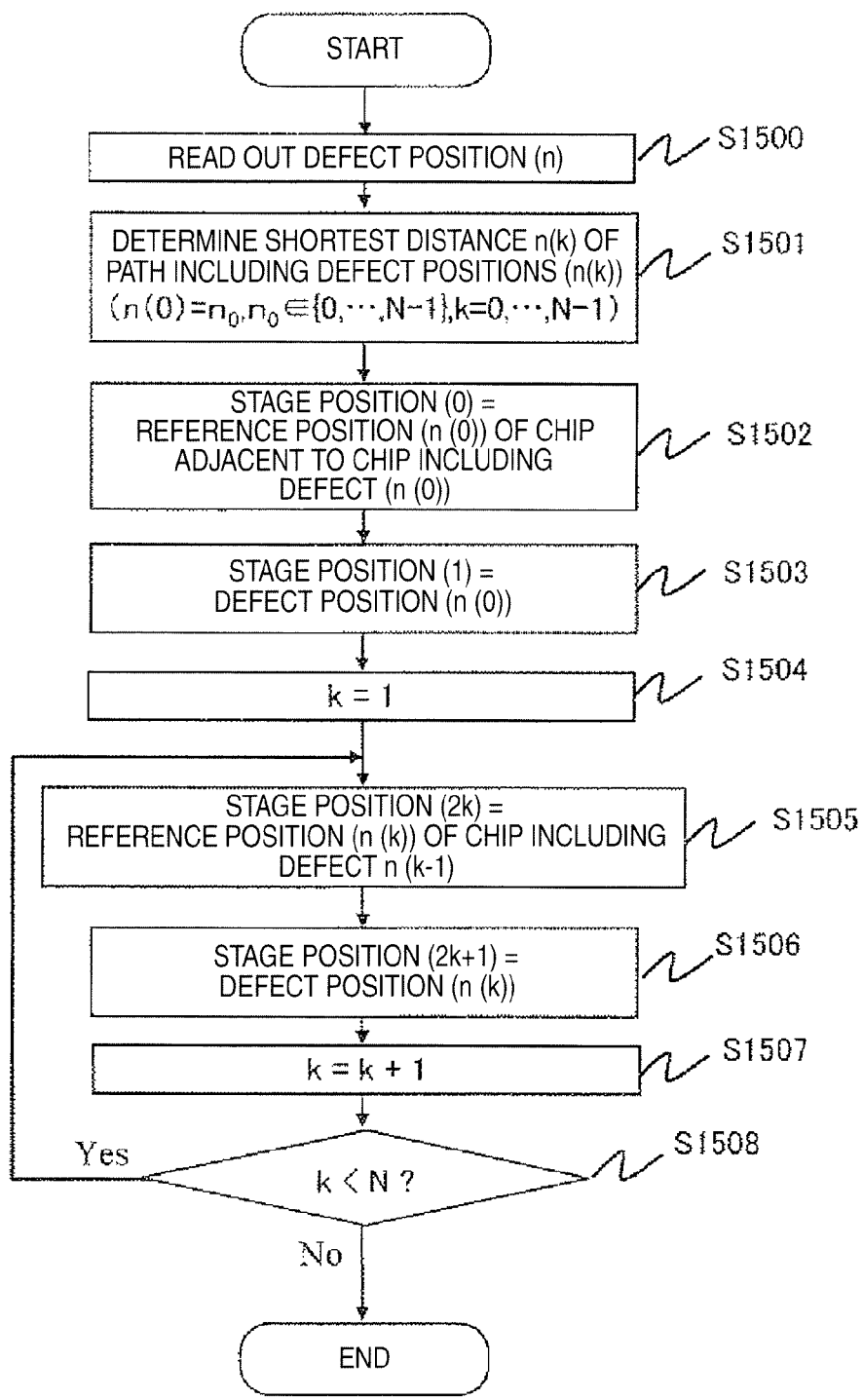
FIG. 15 shows a flow chart of a stage-movement-path generation procedure of embodiment 2.

In order to apply the procedure shown in FIG. 9 to embodiment 2, it is only necessary that the whole processing of FIG. 15 is performed in the step shown in S800 of FIG. 9. The procedure shown in FIG. 10 can be applicable to embodiment 2 as it is. The notations shown in FIG. 11, FIG. 12 and FIG. 13 can be commonly used in embodiment 3. As for the device operations disclosed in FIG. 1 and FIG. 2 in embodiment 1, there is no different part between embodiment 1 and embodiment 2, and the procedure of embodiment 2 can be performed by the devices shown in FIG. 1 and FIG. 2.

In embodiment 2, in addition to the effect described in embodiment 1, there is an effect that, since the range of selection of a reference image-capturing position is limited to one chip, a plurality of chip coordinates need not be processed to select a chip for capturing a multiplying reference image at the time of path generation, and hence the amount of calculation can be reduced.

Embodiment 3

Figure 16:
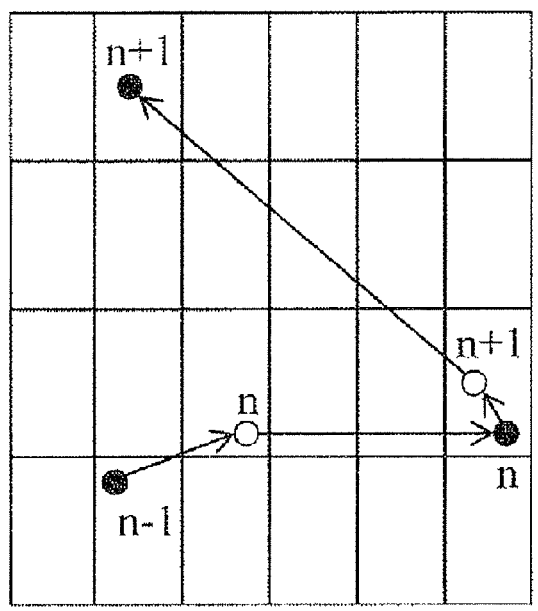
FIG. 16 is view showing a stage-movement path of embodiment 3.

A second embodiment of the present invention will be described by using FIG. 16 and FIG. 17.

An acquisition path of a defect observation image in the second embodiment is generated in such a manner that, as a chip imaged to capture a low-magnification reference image, that is, a reference chip, there is selected a chip located between a just previous defect chip and a next defect chip. As shown in FIG. 16, a reference chip corresponding to a defect (n) is a chip that is located between a chip including a defect (n−1) and the chip including the defect (n). In FIG. 16, as an example, a reference position (n) is located on a defect chip including the defect (n) and a chip adjacent to the defect chip, and is selected so that the sum of the distance between the defect position (n−1) and the reference point (n) and the distance between the reference position (n) and the defect position (n) is minimized. The reference chip corresponding to the defect number n+1 is also selected in the same manner, and thereafter the same processing is repeated.

The stage-movement distance in the case where the reference chips are set in this way is qualitatively compared with the stage-movement distance of the conventional method shown in FIG. 4. In the method of FIG. 4, the moving distance from the imaging of a defect to the imaging of the next defect is the distance of movement from the defect point to the next defect point via a reference image-capturing position shifted from the defect point by one chip. Since, when one side of a triangle is formed by the defect point and the next defect point, the reference position becomes the vertex of the triangle, the moving distance from the defect position to the next defect becomes the sum of the other two sides of the triangle. In the method shown in FIG. 16, a reference position is selected so that the reference position gives the distance which is very close to the distance of a side from the defect position to the next defect position. Therefore, the moving distance in the method shown in FIG. 16 is shorter than the moving distance in the method of FIG. 4.

FIG. 17 shows the stage-movement-position generation procedure which is a part 500 in FIG. 5. First, defect coordinate data having, as information, the defect positions (n) of the defects detected by the inspection device is read out via an external input and output I/F (not shown) of the entire control unit 113 (S1700). Then, N defects to be observation are selected from the read-out defect coordinate data, and a minimum distance path is determined on the basis of the condition that one defect is observed only once when all the N defects are observed (S1701).

A reference image-capturing position of a first defect (k=0) is set as a stage position (0), and a reference position (n (0)) of a chip adjacent to a chip including a defect (n (0)) is set (S1702). Next, the defect position (n (0)) is set as a stage position (1) (S1703). Subsequently, the processing from S1705 to S1708 is repeated at the defect numbers k in order of the determined path. First, a reference position (n (k)), which minimizes the sum of the distance between a defect position (n (k−1)) and the reference position (n (k)) and the distance between the reference position (n (k)) and a defect position (n (k)), is selected as a stage position (2k) (S1705). Then, a stage moving path is generated so that a low-magnification reference image can be captured at the selected reference position (n (k)). Next, the defect position (n (k)) is set as a stage position (2k+1) (S1706). When all the defects are processed, the processing is ended, and when there is a remaining defect, the processing of S1705 to S1708 is repeated.

In order to apply the procedure shown in FIG. 9 to embodiment 3, it is only necessary that the whole processing of FIG. 17 is performed in the step shown in S800 of FIG. 9. The procedure shown in FIG. 10 can be applicable to embodiment 3 as it is. The notations shown in FIG. 11, FIG. 12 and FIG. 13 can be commonly used in embodiment 3. As for the device operations disclosed in FIG. 1 and FIG. 2 in embodiment 1, there is no different part between embodiment 1 and embodiment 3, and the procedure of embodiment 3 can be performed by the devices shown in FIG. 1 and FIG. 2.

In embodiment 3, in addition to the effect described in embodiment 1, there is an effect that, since a reference image-capturing position is also set close to a line segment connecting a defect image-capturing position and a next defect image-capturing position, the sum of the total moving distance can be minimized, and the collection of defect observation images of defects on a wafer can be performed in a short time. Further, since, in embodiment 3, an reference image-capturing position is set closer to a defect image-capturing position than in embodiment 1, image changes due to the process variation on the wafer are hardly caused, and hence a defect image can be stably compared with a reference image, as a result of which the success rate of capturing a defect observation image can also be improved.

The present invention described in the above-described embodiments is featured in that, when a method, in which observing images of defects on a semiconductor wafer are collected by using SEM, and in which a reference image captured by imaging a reference chip is compared with a defect image captured by imaging a defect chip, is used, the sum of stage movement-distance on the wafer can be reduced, and in that, since the imaging position of the reference image is set close to a defect position imaged just before capturing the reference image, SEM focusing process is not required, so that the image acquisition time can be reduced. Further, the present invention is featured in that, since a shortest or nearly shortest path is generated on the basis of the condition that one defect position is observed only once when all the N defect positions are observed, the distance from a reference imaging position to a defect imaging position is also tend to be reduced, in that, when the distance between a reference chip and a defective chip, which are paired and subjected to image comparison, is a fixed distance or less, SEM focusing process for capturing of defect images is not needed, and in that, since, in the process of comparing a reference image with a defect image, the effect of process variation on the wafer surface is also reduced, the reliability of identifying a defect position is improved, so that a defect observation image can be stably captured.

REFERENCE SIGNS LIST

100 . . . Scanning electron microscope device
101 . . . Electron beam
102 . . . Electron beam gun
103 . . . Condenser lens
104 . . . Deflection coil
105 . . . Objective lens
106 . . . Stage
107 . . . Wafer
108 . . . Detector
109 . . . A/D converter
110 . . . Image processing unit
111 . . . Stage controller
112 . . . Electron optical system control unit
113 . . . Entire control unit
114 . . . Control terminal
200 . . . Input/output I/F
201 . . . Image processing control unit
202 . . . Calculation unit
203 . . . Memory
204 . . . Bus
205 . . . Data input I/F

The invention claimed is:

1. A defect inspection method comprising:
a reading-out step of reading out a plurality of positions of defects of a semiconductor wafer, the defects being detected beforehand by an inspection device;
a first imaging step of, in capturing observation images of the defects read-out by the reading-out step, capturing, at a first magnification, a reference image of a chip other than a chip including the defect;
a second imaging step of capturing, at the first magnification, a first defect image including the defect;
a defect position identification step of identifying a defect position on the first defect image by comparing the reference image captured by the first imaging step with the first defect image captured by the second imaging step;
a third imaging step of capturing, as an observation image of the defect, a second defect image on the basis of the defect position identified by the defect position identification step and at a second magnification higher than the first magnification;
a rearrangement step of rearranging the plurality of defects read-out by the reading-out step on the basis of a condition that each said defect is observed only once when all the defects are observed sequentially; and
a stage-movement-path generating step of generating a stage-movement path by selecting, for each defect corresponding to the reference image, a chip which was imaged to capture the associated reference image, and determining stage-movement positions in the first imaging step and the second imaging step such that a sum of distances between said stage-movement positions for each movement from a defect image capturing point and its corresponding successive reference capturing point, is less than a sum of distances between said stage-movement positions for each movement from a reference capturing point and its corresponding successive image capturing point.

2. The defect inspection method according to claim 1, wherein the chip which is imaged to capture the reference image is selected from among a first chip including a defect which was imaged immediately prior to the imaging of the reference image, and a second chip which is adjacent to the first chip.

3. The defect inspection method according to claim 2, wherein a chip which is imaged to capture the reference image is selected from among a first chip including a defect which was imaged immediately prior to the imaging of the reference image, and a second chip which is adjacent to the first chip, and is selected so that a distance between the imaging position of the reference image and the defect position which was imaged immediately prior to the imaging of the reference image is shortest.

4. The defect inspection method according to claim 2, wherein a chip which is imaged to capture the reference image is selected from among a first chip including a defect which was imaged immediately prior to the imaging of the reference image, and a second chip which is adjacent to the first chip, and is selected so that a distance between the imaging position of the reference image and the defect position which was imaged immediately prior to the imaging of the reference image is shortest in a predetermined distance.

5. The defect inspection method according to claim 2, further comprising a step of displaying the generated path on a wafer map.

6. The defect inspection method according to claim 5, wherein the generated path displayed on the wafer map is changed by changing an input value for a distance between the imaging processes and an input value for a time interval between the imaging processes.

7. The defect inspection method according to claim 2, further comprising a step of displaying, during imaging of the defect, an imaging position on the wafer map on which the generated path is displayed.

8. The defect inspection method according to claim 2, wherein the imaging is performed by a scanning electron microscope.

9. The defect inspection method according to claim 1, wherein a chip which is imaged to capture the reference image is a chip including a defect which was imaged immediately prior to the imaging of the reference image.

10. The defect inspection method according to claim 9, wherein, when a distance between the imaging position of the reference image and the defect position which was imaged immediately prior to the imaging of the reference image is less than or not more than a predetermined distance, a chip which is adjacent to the chip including the defect which was imaged immediately prior to the imaging of the reference image is selected as a chip which is imaged to capture the reference image.

11. The defect inspection method according to claim 1, wherein each chip which includes each imaging position of the reference image is selected so that a distance between the defect position which was imaged immediately prior to the imaging of the reference image and the imaging position of the reference image, and a distance between an imaging position of the reference image and the defect position which was imaged immediately after the imaging of the reference image, defines a shortest possible stage-movement path.

12. The defect inspection method according to claim 11, wherein a chip including the imaging position of the reference image is selected from among a first chip including the defect which was imaged immediately prior to the imaging of the reference image, and a second chip which is adjacent to the first chip.

13. The defect inspection method according to claim 12, wherein, when a distance between an imaging position of the reference image and a defect position which was imaged immediately prior to the imaging of the reference image is less than or not more than a predetermined distance, a chip which is imaged to capture the reference image is selected from among a plurality of chips which are adjacent to the chip including the defect which was imaged immediately prior to the imaging of the reference image.

14. The defect inspection method according to claim 1, wherein, in the stage-movement-path generation step, a chip which is imaged to capture the reference image in the first imaging step is selected from among a first chip including the defect imaged immediately prior to the imaging of the reference image, and a second chip which is adjacent to the first chip.

15. The defect inspection method according to claim 14, wherein a chip which is imaged to capture the reference image is selected from among a first chip including the defect which was imaged immediately prior to the imaging of the reference image, and a plurality of second chips which are adjacent to the first chip and located so that a distance between an imaging position of the reference image and a defect position which was imaged immediately prior to the imaging of the reference image is shortest.

16. The defect inspection method according to claim 14, wherein a chip which is imaged to capture the reference image is selected from among a first chip including the defect which was imaged immediately prior to the imaging of the reference image, and a second chip which is adjacent to the first chip, and is selected such that a distance between an imaging position of the reference image and a defect position which was imaged immediately prior to the imaging of the reference image is shortest in a distance not less than a predetermined distance.

17. The defect inspection method according to claim 1, wherein, in the stage-movement-path generation step, a first chip including the defect which was imaged immediately prior to the imaging of the reference image is set as a chip which is imaged to capture the reference image in the first imaging step.

18. The defect inspection method according to claim 17, wherein, when a distance between an imaging position of the reference image and a defect position which was imaged immediately prior to the imaging of the reference image is less than or not more than a predetermined distance, a chip which is imaged to capture the reference image is selected from among a plurality of chips which are adjacent to the first chip including the defect which was imaged immediately prior to the imaging of the reference image.

19. The defect inspection method according to claim 1, wherein, in the stage-movement-path generation step, a chip which is located so that a sum of a distance between a defect position which was imaged immediately prior to the imaging the reference image and an imaging position of the reference image, and a distance between the imaging position of the reference image and the defect position which is imaged immediately after the imaging of the reference image is smallest, is set as a chip which includes the imaging position of the reference image in the imaging step.

20. The defect inspection method according to claim 19, wherein a chip including the imaging position of the reference image is selected from among a first chip including the defect which was imaged immediately prior to the imaging of the reference image, and a second chip which is adjacent to the first chip.

21. The defect inspection method according to claim 20, wherein, when the distance between the imaging position of the reference image and the defect position which was imaged immediately prior to the imaging of the reference image is less than or not more than a predetermined distance, a chip which is imaged to capture the reference image is selected from among a plurality of chips which are adjacent to the first chip including the defect which was imaged immediately prior to the imaging of the reference image.

22. The defect inspection method according to claim 1, wherein, when a distance between an imaging position of the reference image and a defect position which is imaged immediately after the imaging of the reference image is less than or not more than a predetermined distance, a focusing process of a Scanning Electron Microscope (SEM) is not performed at the defect position which is imaged immediately after imaging the reference image.

23. The defect inspection method according to claim 1, further comprising a step of inputting a value of a distance between the images and a value of a time interval between the imaging processes.

24. The defect inspection method according to claim 23, wherein an evaluation value calculated from the distance between the imaging processes and the time interval between the imaging processes satisfies a reference value calculated from said inputted distance and said inputted time interval.

25. The defect inspection method according to claim 23, wherein a product of a distance between the imaging processes and the time interval between the imaging processes is not less than a product of said inputted distance and said inputted time interval.

26. The defect inspection method according to claim 23, wherein the distance between the imaging processes is not less than said inputted distance and the time interval between the imaging processes is not less than said inputted time interval.

27. A defect inspection device comprising:
an image processor configured, for an observation image of a defect, to capture, at a first magnification, a reference image of a chip other than a chip that includes the defect;
the image processor being further configured to capture, at the first magnification, a first defect image including the defect;
the image processor being further configured to identify a defect position on the first defect image by comparing the reference image with the first defect image;
the image processor being further configured to capture, as an observation image of the defect and at a second magnification higher than the first magnification, a second defect image on the basis of the defect position;
a controller configured to rearrange a plurality of said defects on the basis of a condition that each said defect is observed only once when all defects are observed sequentially; and
a stage controller configured to generate a stage-movement path in such a manner that a chip which is imaged to capture the reference image is selected for each of the defects which corresponds to the reference image, and to determine stage-movement positions associated with said captured reference image and said captured first defect image such that a sum of distances between said stage-movement positions for each movement from a defect image capturing point and its corresponding successive reference capturing point, is less than a sum of distances between said stage-movement positions for each movement from a reference capturing point and its corresponding successive image capturing point.

28. The defect inspection device according to claim 27, wherein a chip which is imaged to capture the reference image is selected from among a first chip including the defect which was imaged immediately prior to the imaging of the reference image, and a second chip which is adjacent to the first chip.

29. The defect inspection device according to claim 27, wherein a chip which is imaged to capture the reference image is set as a chip including the defect which was imaged immediately prior to the imaging of the reference image.

30. The defect inspection device according to claim 27, wherein a chip which is located so that a sum of a distance between the defect position which was imaged immediately prior to the imaging of the reference image and an imaging position of the reference image, and a distance between the imaging position of the reference image and the defect position which is imaged immediately after the imaging of the reference image is minimized, is set as a chip including the imaging position of the reference image.

* * * * *